United States Patent
Ray et al.

(10) Patent No.: US 6,887,642 B2
(45) Date of Patent: May 3, 2005

(54) MULTI-LAYER NEGATIVE WORKING IMAGEABLE ELEMENT

(75) Inventors: Kevin Ray, Fort Collins, CO (US); Joanne Ray, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 250 days.

(21) Appl. No.: 10/117,569

(22) Filed: Apr. 5, 2002

(65) Prior Publication Data

US 2003/0194632 A1 Oct. 16, 2003

(51) Int. Cl.$^7$ .............................. G03F 7/021; G03F 7/30
(52) U.S. Cl. ................... 430/160; 430/161; 430/270.1; 430/281.1; 430/302
(58) Field of Search ................... 430/160, 161, 430/270.1, 281.1, 302

(56) References Cited

U.S. PATENT DOCUMENTS

| | | | | |
|---|---|---|---|---|
| 4,588,669 A | * | 5/1986 | Asano | 430/156 |
| 4,956,261 A | | 9/1990 | Pawlowski et al. | |
| 5,047,309 A | | 9/1991 | Koike et al. | |
| 5,476,754 A | * | 12/1995 | Imai et al. | 430/302 |
| 6,165,689 A | * | 12/2000 | Vermeersch et al. | 430/302 |
| 6,294,311 B1 | * | 9/2001 | Shimazu et al. | 430/271.1 |
| 6,309,792 B1 | | 10/2001 | Hauck et al. | 430/270.1 |
| 6,352,811 B1 | | 3/2002 | Patel et al. | 430/270.1 |
| 6,352,812 B1 | | 3/2002 | Shimazu et al. | 430/273.1 |
| 6,358,699 B1 | | 3/2002 | Balint et al. | 435/18 |
| 6,593,054 B2 | * | 7/2003 | Mitsumoto | 430/156 |
| 6,627,386 B2 | * | 9/2003 | Aoshima | 430/309 |
| 2001/0044065 A1 | | 11/2001 | Hauck et al. | |
| 2003/0118949 A1 | * | 6/2003 | Ray et al. | 430/312 |

FOREIGN PATENT DOCUMENTS

| | | |
|---|---|---|
| EP | 0 864 420 | 9/1998 |
| EP | 0 908 305 | 4/1999 |
| EP | 0 908 307 | 4/1999 |
| EP | 0 908 779 | 4/1999 |
| EP | 0 908 784 | 4/1999 |
| EP | 0 940 266 | 9/1999 |
| EP | 0 950 518 | 10/1999 |
| EP | 0 960 728 | 12/1999 |
| EP | 1 023 994 | 8/2000 |
| EP | 1111467 A1 | 6/2001 |
| EP | 1132775 A1 | 9/2001 |
| EP | 1319504 A2 | 6/2003 |
| JP | 2001042509 A | 2/2001 |
| JP | 2001042510 A | 2/2001 |
| WO | WO 01/96119 A1 | 12/2001 |

* cited by examiner

Primary Examiner—John S. Chu
(74) Attorney, Agent, or Firm—RatnerPrestia

(57) ABSTRACT

Multi-layer, negative working imageable elements useful as lithographic printing plate precursors are disclosed. The elements contain, in order, a support; an underlayer; and an imageable layer. The imageable layer comprises a negative working imageable composition; and the underlayer is soluble or dispersible in a developer. Elements that can be imaged with ultraviolet or visible radiation and elements that can be imaged with infrared radiation or with heat are disclosed.

27 Claims, No Drawings

MULTI-LAYER NEGATIVE WORKING IMAGEABLE ELEMENT

FIELD OF THE INVENTION

The invention relates to imageable elements useful in lithographic printing. More particularly, this invention relates multi-layer, negative working imageable elements useful as lithographic printing plate precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

If after exposure to radiation, the exposed regions of the imageable layer are removed in the developing process, revealing the underlying hydrophilic surface of the support, the element is positive working. Conversely, if the developing process removes the unexposed regions, and the exposed regions remain, the element is negative working. In each instance, the regions of the radiation-sensitive layer (i.e., the image areas) that remain are ink-receptive and the regions of the hydrophilic surface revealed by the developing process accept water, typically a fountain solution, and repel ink.

Negative working imageable elements typically comprise a negative working imageable layer on a support. Prior to exposure, the imageable layer is soluble in or penetrable by a developer so that it is removable by the developer. On exposure, the exposed regions of the imageable layer are "hardened," that is they become insoluble or impenetrable so that they are no longer removable by the developer.

In these single layer elements, the imageable layer must (1) have good imaging characteristics using conventional imaging techniques, and (2) provide a good printing surface, with good resistance to the chemicals used in lithographic printing, after imaging. These two requirements are often incompatible. Modifications of the imageable layer that improve imaging characteristics, i.e., increase imaging speed and/or resolution, often adversely affect the on-press performance of the resulting lithographic printing plate. Modifications of the imageable layer that improve on-press performance often adversely affect photospeed and/or resolution. Thus, a need exists for an imageable element in which both the imaging characteristics of the imageable layer and the performance properties of the resulting printing plate can be independently optimized.

SUMMARY OF THE INVENTION

In one aspect, the invention is a multi-layer negative working imageable element useful as a lithographic printing plate precursor. The element comprises, in order:

a support;
an underlayer; and
an imageable layer;
in which:
the imageable layer comprises a negative working imageable composition; and
the underlayer is soluble or dispersible in a developer.

In one embodiment, the photosensitive element additionally comprises a photothermal conversion material. In a preferred embodiment, the underlayer comprises a copolymer of N-phenylmaleimide, methacrylamide, and methacrylic acid.

In another embodiment, the imageable layer is both thermally imageable (i.e., imageable with infrared radiation and/or with heat) and imageable by ultraviolet and/or visible radiation. The element may be imaged either thermally, or with ultraviolet and/or visible radiation.

In another aspect, the invention is a method for producing an image useful as a lithographic printing plate by exposing and developing the imageable element. Imaging may be carried out thermally or with ultraviolet radiation. In yet another aspect, the invention is a printing plate produced by this method.

DETAILED DESCRIPTION OF THE INVENTION

Unless the context indicates otherwise, in the specification and claims, the terms "first polymeric material," "second polymeric material," "photothermal conversion material," "coating solvent, "and similar terms also refer to mixtures of such materials. Unless indicated otherwise, percentages refer to percents by weight.

Imageable Elements

In one aspect, the invention is negative working imageable element. The element comprises a substrate, an underlayer, and an imageable layer.

Substrate

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion promoting materials, such as alkoxysilanes, aminopropyltrimethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 μm. Typically, the substrate comprises an interlayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and imageable layer) may be coated with an antistatic agent and/or a slipping layer or matte layer to improve handling and "feel" of the imageable element.

Underlayer

The underlayer is between the hydrophilic surface of the substrate and the imageable layer. After imaging, it is removed by the developer in the unexposed regions to reveal the underlying hydrophilic surface of the substrate. It is preferably soluble in the alkaline developer to prevent sludging of the developer.

The underlayer comprises a first polymeric material. The first polymeric material is dispersible, or, preferably, soluble in an alkaline developer. In addition, the first polymeric material is preferably insoluble in the solvent used to coat the imageable layer so that the imageable layer can be coated over the underlayer without dissolving the underlayer.

Polymeric materials useful as the first polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are copolymers that comprise N-substituted maleimides, especially N-phenylmaleimide; polyvinylacetals; methacrylamides, especially methacrylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in alkaline developers. In addition, they are soluble in methyl lactate/methanol/dioxolane (15:42.5:42.5 wt %) mixture, which can be used as the coating solvent for the underlayer. However, they are poorly soluble in solvents such as acetone, which can be used as solvents to coat the imageable layer on top of the underlayer without dissolving the underlayer. These polymeric materials are typically resistant to washes with 80 wt % diacetone alcohol/20 wt % water.

Another group of preferred polymeric materials for the first polymeric material are alkaline developer soluble copolymers that comprise a monomer that has a urea bond in its side chain (i.e., a pendent urea group), such are disclosed in Ishizuka, U.S. Pat. No. 5,731,127. These copolymers comprise about 10 to 80 wt %, preferably about 20 to 80 wt %, of one of more monomers represented by the general formula:

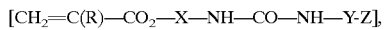

in which R is —H or —CH$_3$; X is a bivalent linking group; Y is a substituted or unsubstituted bivalent aromatic group; and Z is —OH, —COOH, or —SO$_2$NH$_2$.

R is preferably —CH$_3$. Preferably X is a substituted or unsubstituted alkylene group, substituted or unsubstituted phenylene [C$_6$H$_4$] group, or substituted or unsubstituted naphthalene [C$_{10}$H$_6$] group; such as —(CH$_2$)$_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —(CH$_2$CH$_2$)—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —SO$_2$NH$_2$, preferably —OH. A preferred monomer is:

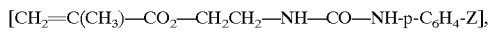

in which Z is —OH, —COOH, or —SO$_2$NH$_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the imageable layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Other alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)-methacrylamide, N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, one polymeric material has a one-minute soak loss of less than about 20%, more preferably less than about 10%, and most preferably less than about 5% in 80 wt % diacetone alcohol/20 wt % water, and the other polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 g/m², soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, more preferably greater than about 0.6. In favorable cases, a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacrylamide; and acrylic and/or methacrylic acid, especially methacrylic acid with (2) an alkaline soluble copolymer that comprises a urea in its side chain or with an alkaline soluble copolymer that comprises 10 to 90 mol % of a sulfonamide monomer unit, especially one that comprises N-(p-aminosulfonylphenyl) methacrylamide, N-(m-aminosulfonylphenyl) methacrylamide, N-(o-aminosulfonylphenyl)methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used as the first polymeric material, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight these polymeric materials in the underlayer. These materials together typically comprise at least about 50 wt %, preferably at least about 60 wt %, and more preferably at least about 65 wt %, of the underlayer, based on total weight of the materials in the underlayer. When present, up to about 20 wt %, preferably about 1 to about 20 wt %, other polymeric materials may be present in the underlayer, based on the total amount of all the polymeric materials in the underlayer.

Imageable Layer

The imageable layer comprises a negative working imageable composition. When the composition is imaged, the imaged regions are "hardened" (i.e., rendered less soluble in the developer) by the imaging step. When the imaged plate is developed, the unexposed regions are removed and the exposed regions remain to form the image (i.e., the imageable composition is negative working). Typically these compositions comprise materials that undergo photocrosslinking, photodimerization, and/or photopolymerization on imaging. Negative working systems imageable by ultraviolet radiation are discussed, for example, in Chapter 2 of *Photoreactive Polymers: the Science and Technology of Resists*, A. Reiser, Wiley, New York, 1989, pp. 22–64.

The imageable layer may comprise a negative working imageable composition comprising a polymeric diazonium compound and a binder (second polymeric material). Typically the polymeric diazonium compound is a diazonium polycondensation product. Diazonium polycondensation products are well known to those skilled in the art. They may be prepared, for example, by condensation of a diazo monomer, such as is described in Toyama, U.S. Pat. No. 4,687,727, with a condensation agent, such as formaldehyde, acetaldehyde, propionaldehyde, butyraldehyde, isobutyraldehyde or benzaldehyde. Mixed condensation products may be used that comprise units derived from condensable compounds, in particular from aromatic amines, phenols, phenol ethers, aromatic thioethers, aromatic hydrocarbons, aromatic heterocycles or organic acid amides. Especially advantageous examples of diazonium polycondensation products are reaction products of diphenylamine-4-diazonium salts, optionally having a methoxy group in the phenyl group bearing the diazo group, with formaldehyde or 4,4'-bis-methoxymethyl diphenyl ether. Aromatic sulfonates such as 4-tolylsulfonate or mesitylene sulfonate, tetrafluoroborate, hexafluorophosphate, hexafluoroantimonate and hexafluoroarsenate are particularly suitable as anions of these diazo resins. The diazonium polycondensation product preferably comprises about 3 to about 60 wt % of the imageable composition.

Numerous binders (second polymeric materials) are known. One such system is described in Baumann, U.S. Pat. No. 5,700,619, incorporated herein by reference. The binder is an acetalized polyvinyl alcohol (polymeric acetal resin), with pendent carboxyl groups. These binders may be produced by reaction of polyvinyl alcohol with aldehydes such as acetaldehyde, propanaldehyde, and/or butyraldehyde, and with 4-carboxybenzaldehyde.

Binders that additionally comprise about 0.01 to about 2 mol % of a free radical polymerization-inhibiting vinyl acetal unit, such as may be produced by reaction of the binder with 3,5-di-t-butyl-4-hydroxybenzaldehyde; 3,5-d-t-butyl-2-hydroxybenzaldehyde; 3-t-butyl-2-hydroxybenzaldehyde; 5-t-butyl-2-hydroxybenzaldehyde; 4-t-butyl-2,6-diformylphenol; 2-hydroxy-5-methoxybenzaldehyde; 2,4-dihydroxybenzaldehyde; 2,5-dihydroxybenzaldehyde; 2-hydroxy-4-methylbenzaldehyde; 2-hydroxy-4-methoxybenzaldehyde; 3,4-dihydroxybenzaldehyde; 2,3,4-trihydroxybenzaldehyde; 2,4,5-trihydroxybenzaldehyde; or 2,4,6-trihydroxybenzaldehyde may also be useful for producing compositions with longer shelf life. These binders are described in U.S. Pat. No. 6,783,913.

The composition may comprise other ingredients that are conventional components of imageable compositions.

Exposure indicators are well known. They generate color in the imaged regions useful for gauging the degree of exposure and for detecting defects in the image prior to development. Triaryl methane dyes (such as Victoria blue BO, Victoria blue R, Crystal Violet) or azo dyes (such as 4-phenyl-azo-diphenylamine, azobenzene or 4-N,N-dimethylamino-azobenzene) are preferred. When present, the exposure indicator comprises about 0.02 to about 10 wt %, preferably about 0.5 to about 6 wt %, of the imageable composition.

Suitable colorants for improving the contrast of the image on the imaged and developed photosensitive element include dyes that dissolve well in the coating solvent and pigments that are easily introduced in the dispersed form. Suitable contrast dyes include, for example, rhodamine dyes, methyl violet dyes, methyl violet pigments, anthraquinone pigments, phthalocyanine dyes, and phthalocyanine pigments. When present, the colorant comprises about 1 to about 15 wt %, preferably about 2 to about 10 wt %, of the imageable composition.

The imageable composition may comprise one or more stabilizing acids. These stabilizing acids include, for example, phosphoric, citric, benzoic, m-nitrobenzoic, benzenesulfonic, m-nitrobenzenesulfonic, p-anilino azobenzene sulfonic, p-toluene sulfonic and tartaric acids. In some formulations a mixture of several different acids is advantageous. Phosphoric acid is preferably used as stabilizing acid. When present, the acid typically comprises about 0.2 to about 6 wt % of the imageable composition.

The imageable composition may comprise one or more plasticizers. Suitable plasticizers include, for example, dibutyl phthalate, triaryl phosphate and dioctyl phthalate. Dioctyl phthalate is especially preferred. When present, the plasticizer typically comprises about 0.25 to about 2 wt % of the imageable composition.

The binder typically comprises about 5 to about 95 wt %, preferably about 15 to about 60 wt %, most preferably about 25 to about 50 wt %, of the imageable composition. The diazo resin typically comprises about 3 to about 60 wt %, preferably about 10 to about 50 wt % of the imageable composition. Other ingredients typically comprise 0 to about 25 wt %, preferably about 2 to about 15 wt % of the imageable composition.

The imageable composition may be a photosensitive composition. Preferred photosensitive compositions are photopolymerizable compositions, which comprise one or more monomers, one or more binders (second polymeric materials), and one or more photoinitiator systems. Such systems are well known in the art, and are discussed, for example, in *Photopolymers: Radiation Curable Imaging Systems*, B. M. Monroe, in *Radiation Curing: Science and Technology*, S. P. Pappas, Ed., Plenum, New York, 1992, pp. 399–440.

Photopolymerizable compositions comprise at least one ethylenically unsaturated compound that undergoes free-radical initiated polymerization, generally known as a monomer. The monomers are typically multifunctional, i.e., they comprise more than one ethylenically unsaturated, free radical polymerizable group. Typical multifunctional monomers are unsaturated esters of alcohols, preferably acrylate and methacrylate esters of polyols, such as, trimethylolpropane tri- and tetra-acrylate and methacrylate, the tri- and tetra-acrylate and methacrylate esters of ethoxylated trimethylolpropane, diethylene glycol diacrylate and dimethacrylate, triethylene glycol diacrylate and dimethacrylate, tetraethylene glycol diacrylate and dimethacrylate, polyethylene glycol diacrylate and dimethacrylate, glycerol tri-acrylate and tri-methacrylate, ethylene glycol dimethacrylate, pentaerythritol tri- and tetra-acrylate and methacrylate, dipentaerythrol penta- and hexa-acrylate and methacrylate, tripropylene glycol diacrylate and dimethacrylate, the di-(2-acryloxyethyl)ether and the di-(2-methacryloxyethyl)ether of bisphenol A, ethoxylated bisphenol A diacrylate and dimethacrylate, 1,6-hexanediol diacrylate and dimethacrylate, neopentyl glycol diacrylate and dimethacrylate, and butanediol diacrylate and dimethacrylate. Monofunctional monomers, which are sometimes used in combination with multifunctional monomers include, for example, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, iso-bornyl acrylate and methacrylate, phenyl acrylate and methacrylate, 2-phenylethyl acrylate and methacrylate, and tetrahydrofurfuryl acrylate and methacrylate. Other monomers include, for example, unsaturated amides, such as 1,6-hexamethylene bis-acrylamide, vinyl esters such as divinyl succinate, divinyl phthalate, and divinyl benzene-1,3-disulfonate, styrene, divinyl benzene, and derivatives thereof, and N-vinyl compounds, such as N-vinyl pyrrolidone and N-vinyl carbazole. Oligomers and/or prepolymers, such as urethane acrylate and methacrylate, epoxide acrylate and methacrylate, polyester acrylate and methacrylate, polyether acrylate and methacrylate or unsaturated polyester resins, may also be used.

The composition comprises at least one preformed macromolecular polymeric material, generally known as a binder (second polymeric material). In general, the binder should be swellable or, preferably, soluble in the coating solvent and compatible with the other components of the photopolymerizable system.

Numerous binders useful in photopolymerizable compositions are known to those skilled in the art. Representative binders include, for example, poly(methyl methacrylate) and polymers and copolymers of alkyl acrylates such as methyl acrylate, and/or alkyl methacrylates such as methyl methacrylate with methacrylic acid, and/or acrylic acid; poly (vinyl acetate) and its partially hydrolyzed derivatives; polyvinyl acetals; polyurethanes; gelatin; cellulose esters and ethers, such as cellulose acetate butyrate; and polyethylene oxides. Representative binders are listed in Ishikawa, U.S. Pat. No. 4,481,276.

The binder is preferably selected from the group consisting of polyvinyl acetals, acrylics and polyurethanes. For developability in alkaline developers, the binder preferably comprises acidic groups. The most preferred acid group is a carboxylic acid group. Typically the binder is an acrylic binder with an acid number in the range of 20 to 180 mg KOH/g.

When the element is to be imaged with ultraviolet or visible radiation, a free radical generating initiating system activatable by ultraviolet and/or visible radiation, known as a photoinitiating system, may be present to facilitate polymerization of the polymerizable monomers. The photoinitiator system absorbs in ultraviolet and/or visible regions of the spectrum, i.e., in the range of from 300 to 800 nm, preferably in the ultraviolet, i.e. 300 nm to 400 nm.

The photoinitiating system may be a single compound or a mixture of compounds. Suitable photoinitiating systems are disclosed in "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–326. Typical free radical photoinitiating compounds include Michlers ketone/benzophenone; benzophenone, 2-hydroxy-2-methyl-1-phenylpropan-1-one (DAROCUR® 1173); 2,4,6-trimethylbenzolyl-diphenylphosphine oxide (LUCERIN® TPO); 2-isopropyithloxanthone; 2-chlorothioxanthone; 2,2-dimethoxy-2-phenyl-acetophenone (IRGACURE® 651, LUCERIN® BDK); 2-methyl-1-[4-(methylthio)phenyl]-2-morpholinopropanone-1 (IRGACURE® 907); 1-hydroxycyclohexylphenyl ketone (HCPK, IRGACURE® 184); bis(2,6-dimethoxybenzolyl)-2,4,4-trimethyl-pentylphosphine oxide; and combinations thereof.

When the imageable layer comprising a photopolymerizable composition is to be imaged with infrared radiation, a thermally activatable initiator system is typically present instead, or in addition, to the photoinitiator system that is activatable to ultraviolet and/or visible radiation. A thermally activatable initiator system is one that can be activated to produce free radicals by infrared radiation and/or with heat. A photothermal conversion material is typically present in the imageable layer, typically as part of the thermally activatable photoinitiator system.

Thermally activatable photoinitiator systems are disclosed, for example, in Hauck, U.S. Pat. No. 6,309,792. These systems comprise at least one photothermal conversion material, at least one compound capable of producing free radicals and at least one polycarboxylic acid comprising an aromatic moiety substituted with a heteroatom selected from the group consisting of N, O and S and also at least two carboxyl groups wherein at least one of the carboxyl groups is bonded to the heteroatom via a methylene group. Suitable compounds capable of producing free radicals include, for example, halo-substituted-s-triazines, such as 2,4,6-tri (trichloromethyl)-s-triazine, 2-phenyl-4,6-bis-trichloromethyl)-s-triazine, 2-(4-methoxyphenyl)-4,6-bis (trichloromethyl)-s-triazine, 2-(4-chlorophenyl)-4,6-bis-(trichloromethyl)-s-triazine, and 2,4,6-tri-(tribromomethyl)-s-triazine; other halogenated compounds, such as tribromomethylphenylsulfone, and 1,2,3,4-tetrabromo-n-butane; and onium compounds, such as N-methoxy-4-phenylpyridinium tetrafluoroborate, 2-hydroxytetradecyloxyphenyl phenyliodonium hexafluoroantimonate, and 2-methoxy-4-phenylaminobenzene diazonium hexafluorophosphate.

Suitable polycarboxylic acid include those of the following structure:

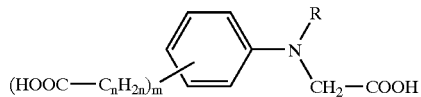

in which n is an integer from 1 to 5, m is an integer from 1 to 5, and R is hydrogen or an alkyl group of 1 to 6 carbon atoms. A suitable polycarboxylic acid is anilino diacetic acid.

Photopolymerizable compositions typically comprise binder(s) 25 to 90 wt %, preferably 10 to 60 wt %; monomer(s), 5 to 80 wt %, preferably, 15 to 70 wt %; photoinitiator system, 0.01 to 15 wt %; and other ingredients, 0 to 20 wt %, typically 0 to 10 wt %.

A hybrid system comprising a combination of a diazonium poly-condensation product and a polymerizable system may be advantageous for certain applications. The compositions of such hybrid systems preferably comprise 1 to 50 wt % diazonium polycondensation products, 0.5 to 20 wt % photoinitiators as well as 5 to 80 wt % free radical polymerizable components.

Photocrosslinkable systems typically comprise at least one binder and a photoactivated at least bifunctional crosslinking agent that crosslinks the binder on irradiation. Organic azides, which are believed to form nitrenes on irradiation, have been used to crosslink binders. Diazido compounds, such as the disulfonated derivative of 4,4'-diazidostilbene, are preferred azides for photocrosslinking.

Photodimerizable systems comprise a binder that forms a crosslink on irradiation. Photocrosslinkable binders include, for example, the polyvinyl alcohols functionalized with cinnamate groups, such as are described in Minsk, U.S. Pat. Nos. 2,690,966, and 2,725,372, or with N-alkyl styrylpyridinium or N-alkyl styrylquinolinium groups, such as are described in, for example, Ichimura, U.S. Pat. Nos. 4,272, 620; 4,287,335; 4,339,524; 4,564,580; and 4,777,114. Other photocrosslinkable systems are described in, for example, in Osada, U.S. Pat. No. 3,804,628, and Aoshima, U.S. Pat. No. 5,240,808.

Other components conventionally added to photopolymerizable compositions can be present to modify the physical properties of the imageable layer. Such components include, for example: chain transfer agents, plasticizers, thermal stabilizers, adhesion modifiers, surfactants, coating aids, dyes, pigments, plasticizers, and components, such as leucodyes, that produce printout images.

A plasticizer may be present to modify adhesion, flexibility, hardness, and other mechanical properties of the photosensitive layer in a conventional fashion. The plasticizer should be compatible with the binder as well as the other components of the negative working composition. Suitable plasticizers include dibutyl phthalate, dioctyl phthalate, didodecyl phthalate, dioctyl adipate, dibutylsebacate, triacetyl glycerine, and tricresyl phosphate. When present, plasticizer preferably comprises 0.25 to 10 wt % of the composition.

Photopolymerizable compositions may comprise a small amount of a polymerization inhibitor to inhibit polymerization of the monomer during preparation and storage of the composition. Suitable polymerization inhibitors include, for example, hydroquinone, p-methoxyphenol, di-t-butyl-p-cresol, pyrogallol, t-butyl catechol, benzoquinone, 4,4'-thio-bis-(3-methyl-6-t-butylphenol), 2,2'-methylene-bis-(4-methyl-6-t-butylphenol) and N-nitrosophenylhydroxylamine salts. When present, thermal polymerization inhibitor preferably comprises about 0.01 wt % to about 5 wt % of the composition.

Surfactants may be added to the composition as coating aids. Typical coating aids are polyethylene oxides, such as POLYOX® WSRN.

Other inert additives can be added such as dyes, pigments and fillers. A dye or pigment may also be added to color the imageable layer. Examples of the coloring agents include pigments such as phthalocyanine-based pigment, azo-based pigment, carbon black and titanium oxide, Ethyl Violet, Crystal Violet, azo-based dyes, anthraquinone-based dyes and cyanine-based dyes. When present, the amount of dyestuff or pigment added is preferably from 0.5 to about 10 wt % based on the entire composition. The coloring agent should not absorb strongly at the wavelength of the imaging radiation. These additives are generally present in minor amounts so as not to interfere with imaging of the composition.

Photothermal Conversion Material

When the element is to be exposed with infrared radiation, the element comprises a photothermal conversion material. The photothermal conversion material may be present in the imageable layer, the underlayer, and/or a separate absorber layer. Typically, the photothermal conversion material is in the underlayer and/or a separate absorber layer, and the imageable layer is substantially free of photothermal conversion material. However, when the imageable layer comprises a thermally activatable initiator system, a photothermal conversion material may be present in the imageable layer as part of the thermally activatable initiator system.

Photothermal conversion materials absorb radiation and convert it to heat. Photothermal conversion materials may absorb ultraviolet, visible, and/or infrared radiation and convert it to heat. Although the first polymeric material may comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0 823 327; Van Damme, EP 0 908 397; DeBoer, U.S. Pat. No. 4,973,572; Jandrue, U.S. Pat. No. 5,244,771; and Chapman, U.S. Pat. No. 5,401,618. Photothermal conversion materials are also disclosed in Hauck, U.S. Pat. No. 6,309,792, especially 5, line 10, to col. 9, line 44. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectralR 830A and SpectralR 840A (Spectra Colors), and IR Dye A and IR Dye B, whose structures are shown below.

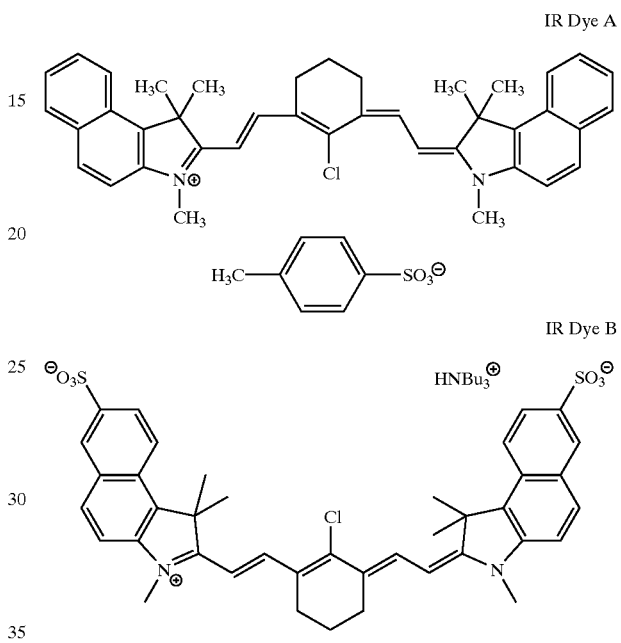

The amount of photothermal conversion material in the element is generally sufficient to provide an optical density of at least 0.05, and preferably, an optical density of from about 0.5 to about 2 at the imaging wavelength. The amount of an absorber required to produce a particular optical density can be determined from the thickness of the layer and the extinction coefficient of the absorber at the wavelength used for imaging using Beers law.

Preparation of the Imageable Elements

The imageable element may be prepared by sequentially applying the underlayer over the hydrophilic surface of the hydrophilic substrate and then applying the imageable layer over the underlayer using conventional coating and/or lamination methods. However, it is important to avoid intermixing the layers during this process.

The term "solvent" includes mixtures of solvents, especially mixtures of organic solvents. Selection of the solvents used to coat the layers depends on the nature of the first polymeric material, the photothermal conversion material, the second polymeric material, and the other ingredients present in the layers. To prevent the underlayer from dissolving and mixing with the imageable layer when the imageable layer is coated over the underlayer, the imageable layer should be coated from a solvent in which the underlayer is essentially insoluble.

The layers may be applied by any conventional method. Typically the ingredients are dispersed or dissolved in a suitable coating solvent, and the resulting mixtures coated by conventional methods, such as spin coating, bar coating, gravure coating, roller coating, dip coating, air knife coating, gravure offset coating, hopper coating, blade coating, wire doctor coating, and spray coating. Drying of the photosensitive element to remove the coating solvent may be carried out using heated air or by heating in an oven.

Alternatively, the underlayer, the imageable layer or both layers may be applied by conventional extrusion coating methods from a melt mixture of layer components. Typically, such a melt mixture contains no volatile organic solvents.

The coating weight of the underlayer is typically greater than the coating weight of the imageable layer. The underlayer typically has a coating weight of about 0.5 to about 2.5 $g/m^2$, more typically about 1 to about 2 $g/m^2$, and even more typically about 2 $g/m^2$. The coating weight of the imageable layer is typically about 0.5 to about 1.5 $g/m^2$, more typically about 0.7 to about 1.0 $g/m^2$.

Imaging and Processing

The element may be imaged with either ultraviolet or infrared radiation, using well-known methods.

The elements may imaged by exposure to ultraviolet radiation that is absorbed by the photoreactive components of the element. Any convenient source or sources of ultraviolet radiation providing wavelengths in the region of the spectrum that overlap the absorption of the photoreactive components of the imageable layer can be used for imaging. Conventional light sources include carbon arc lamps, mercury lamps, xenon lamps, tungsten lamps, metal halide lamps, and fluorescent lamps. Coherent light sources are lasers, such as xenon, argon ion, and ionized neon lasers, as well as tunable dye lasers and the frequency doubled neodymium: YAG laser. Imagewise exposure is typically carried out through a photomask, but direct digital exposure with a laser emitting at the appropriate wavelength is also possible.

Thermal imaging may be accomplished with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm or at about 1056 nm. Suitable commercially available imaging devices include image setters such as the Creo Trendsetter (CREO, British Columbia, Canada) and the Gerber Crescent 42T (Gerber).

Alternatively, the element may be imaged using a conventional apparatus containing a heated stylus or thermal printing head. A suitable commercially available hot stylus imaging device is the GS 618–400 Thermal Plotter (Oyo Instruments, Houston, Tex., USA).

When imaging is carried out with a thermal head, it is unnecessary that the element comprise a photothermal conversion material. However, elements that absorb infrared radiation can be imaged with a thermal head. Imageable layers that are both thermally imageable and imageable with ultraviolet and/or visible radiation can be imaged with ultraviolet and/or visible radiation or thermally, with a thermal head, or with infrared radiation. When imaging is carried out with infrared radiation, the element typically additionally comprises a photothermal conversion material.

Imaging produces an imaged element, which comprises a latent image of unexposed regions and exposed regions. Development of the imaged element to form a lithographic printing plate, or printing form, converts the latent image to an image by removing the unexposed regions, revealing the hydrophilic surface of the underlying substrate.

Useful developers are aqueous solutions having a pH of about 7 or above. Preferred aqueous alkaline developers are those that have a pH between about 8 and about 13.5, typically at least about 9, preferably at least about 10. Both wholly aqueous developers, i.e., those that do not contain an added organic solvent, and developers that contain an organic solvent may be used. Useful developers include commercially available developers, such as PC3000, PC955, P956, and 9000, aqueous alkaline developers each available from Kodak Polychrome Graphics LLC. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

Typically the developer is applied to the imaged element by rubbing or wiping the imageable layer with an applicator containing the developer. Alternatively, the imaged element may be brushed with the developer or the developer may be applied to the element by spraying the imageable layer with sufficient force to remove the unexposed regions. In either instance, a developed element is produced.

The developed negative working element comprises (1) regions in which the imageable layer and underlayer have been removed in the unexposed regions revealing the underlying surface of the hydrophilic substrate, and (2) complimentary exposed regions in which the layer or layers have not been removed. The regions in which the imageable layer and underlying underlayer have not been removed are ink receptive.

Once the imageable element has been imaged and developed, printing can then be carried out by applying a fountain solution and then a lithographic ink to the image on the surface of the element. The fountain solution is taken up by the unimaged (unexposed) regions, i.e., the surface of the hydrophilic substrate revealed by the imaging and development process, and the ink is taken up by the imaged (exposed) regions. The ink is then transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

INDUSTRIAL APPLICABILITY

The imageable elements are useful as lithographic printing plate precursors in which the imaging characteristics of the imageable layer and the performance properties of the resulting printing plate can be independently optimized. The imaging characteristics of the imageable element are primarily due to the properties of the imageable layer, but the performance properties of the resulting printing plate are primarily due to the properties of the underlayer. Thus, the imaging characteristics of the imageable element and the performance properties of the resulting printing plate can be independently optimized. In addition, the element may be imaged by either ultraviolet or infrared radiation.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. The indicated percentages are percentages by weight based on the total solids in the coating solution.

Glossary

Blue Dye B Simbase Victoria Blue FBO 23363 (Charkit, Darien Conn., USA)
Blue Pigment A 13.8% solids dispersion of resin B with Irgalith Blau GLG (copper phthalocyanine) (96.9%) in 1-methoxypropan-ol (86.2%) (Eckart Zulch, Germany)
BKS-5928 UCAR resole phenolic resin (Union Carbide, Danbury Conn., USA)
BYK 307 Polyethoxylated dimethylpolysiloxane copolymer (Byk-Chemie, Wallingford, Conn., USA)
Copolymer 1 Copolymer of N-phenylmaleimide, methacrylamide, and methacrylic acid (45:35:20 mol %)
Diazo MSPF6 2-Methoxy-4-aminophenyl diazonium hexafluorophosphate (Diversitec, Ft. Collins, Colo., USA)
Ethyl Violet C.I. 42600; CAS 2390-59-2 ($\lambda_{max}$=596 nm) [(p-$(CH_3CH_2)_2NC_6H_4)_3C^+Cl^{31}$]
IR Dye A Infrared absorbing dye ($\lambda_{max}$=830 nm) (Eastman Kodak, Rochester, N.Y., USA)
N-9P Novolac resin (Eastman Kodak, Rochester, N.Y., USA)
Nega 107 Negative diazo resin derived from condensation of 3-methoxy-diphenylamine-4-diazonium sulfate and 4,4'-bis-methoxymethyldiphenylether, isolated as mesitylene sulfonate salt (Panchim, Lisses, France)
PADA 4-(Phenylazo)diphenylamine (Panchim, Lisses, Cedex, France)
Resin B Polymeric acetal resin derived from polyvinyl alcohol, in which 17.4 mol % of the hydroxyl groups are functionalized with acetaldehyde, 39.4 mol % of the hydroxyl groups are functionalized with butyraldehyde, 5.7 mol % of the hydroxyl groups are functionalized with 4-carboxybenzaldehyde, 1.5 mol % of the hydroxyl groups are functionalized with acetic acid, and 36 mol % of the hydroxyl groups are unfunctionalized (see, Baumann, U.S. Pat. No. 5,700,619)
XDSA 1,3-dimethyl-4,6-benzene disulfonanilide Example 1

This example illustrates preparation and evaluation of a negative working multi-layer imageable element that comprises a photothermal conversion material in the underlayer. The element was prepared as follows:

Underlayer A coating solution containing Copolymer 1 (84.7 wt %), IR Dye A photothermal conversion material (15.2 wt %), and 0.1 wt % BYK-307 in butyrolactone/methyl ethyl ketone/water/1-methoxypropan-2-ol (15:20:5:60 by weight) was coated onto a substrate with a wire wound bar. The underlayer coating weight was 2.0 g/m². The substrate was a 0.3 mm (12 gauge) aluminum sheet that had been electrograined, anodized, and treated with a solution of polyvinylphosphonic acid. The resulting intermediate element, consisting of the underlayer on the substrate, was dried at 100° C. for 90 sec.

Imageable Layer A coating solution containing Resin B (43.48 wt %), Nega 107 (40.14 wt %), PADA (0.67 wt %), and Blue Pigment A (15.71 wt %) in methanol/methyl ethyl ketone/1-methoxypropan-2-ol/ethyl lactate (42:28:19:11 by weight) was coated over the underlayer with a wire wound bar. The imageable layer coating weight was 1.0 g/m². The resulting intermediate element, consisting of the underlayer on the substrate and the imageable layer on the underlayer, was dried at 100° C. for 90 sec.

After 24 hr, an element was exposed with ultraviolet light through a photomask in a contact light frame (Olec A1 985 with a light integrator, Millington Machine, Torrance, Calif.) with 240 mJ/cm² of imaging energy. The exposed element was developed (60 sec dwell time, water rinse) in a developer consisting of a 50:50 (volume to volume) mixture of 956 developer (solvent based developer from Kodak Polychrome Graphics, Norwalk, Conn., USA) and water. The unexposed regions were removed by the developer leaving the exposed regions. An accurate copy of the mask image was formed.

Example 2

This example illustrates preparation and evaluation of negative working multi-layer imageable element that does not contain a photothermal conversion material. The multi-layer imageable element was prepared as follows:

Underlayer A coating solution containing Copolymer 1 (99.9 wt %) and 0.1 wt % BYK-307 in butyrolactone/methyl ethyl ketone/water/1-methoxypropan-2-ol (15:20:5:60 by weight) was coated onto the substrate of Example 1. The underlayer coating weight was 2.0 g/m². The resulting intermediate element, consisting of the underlayer on the substrate, was dried at 100° C. for 90 sec.

Imageable Layer The imageable layer of Example 1 was coated on the underlayer. The imageable layer coating weight was 1.0 g/m². The resulting intermediate element, consisting of the underlayer on the substrate and the imageable layer on the underlayer, was dried at 100° C. for 90 sec.

After 24 hr, an element was exposed with ultraviolet light and developed following the procedure of Example 1. The unexposed regions were removed by the developer leaving the exposed regions. An accurate copy of the mask image was formed.

Comparative Example 1

This example illustrates a negative working imageable element that does not comprise an underlayer or a photothermal conversion material.

The imageable layer of Example 1 was coated directly onto the substrate of Example 1 following the procedure of Example 1. The coating weight was 1.0 g/m². The resulting element, consisting of the imageable layer on the substrate, was dried at 100° C. for 90 sec.

Example 3

This example illustrates preparation and evaluation of a negative working multi-layer imageable element that contains a photothermal conversion material in the underlayer. A coating solution containing Resin B (52.67 wt %), Nega 107 (41.33 wt %), PADA (0.67 wt %), and ethyl violet (5.33 wt %) in methanol/methyl ethyl ketone/1-methoxypropan-2-ol/ethyl lactate (42:28:14:16 by weight) was coated over the underlayer of Example 1 with a wire wound bar. The coating weight was 1.0 g/m². The resulting element, consisting of this imageable layer, the underlayer of Example 1, and the substrate of Example 1, was dried at 100° C. for 90 sec.

After 24 hr, an element was exposed with ultraviolet light and developed following the procedure of Example 1. The developer removed the unexposed regions leaving the exposed regions. An accurate copy of the mask image was formed.

Comparative Example 2

This example illustrates preparation and evaluation of a negative working imageable element that does not comprise an underlayer. The imageable layer of Example 3 was coated directly on the substrate of Example 1. The coating weight was 1.0 g/m². The resulting element, consisting of the imageable layer of Example 3 on the substrate of Example 1, was dried at 100° C. for 90 sec.

Example 4

The imageable elements of Examples 1 and 2 and Comparative Examples 1 (C1) and 2 (C2) were flood exposed with 240 and with 480 mJ/cm² of ultraviolet radiation. Each element was evaluated with the drop test. A large drop of a solvent was placed on the imageable layer of each imageable element at room temperature, and the time required for dissolution of the layer noted. Two solvents were used. Solvent mix A (diacetone/alcohol-80:20 by volume) tests resistance to a UV wash. Solvent mix B (2-butoxyethanol/water-80:20 by volume) tests resistance to alcohol sub fountain solution. The elements of Examples 1, 2, and C1 all have the same imageable layer. The elements of Examples 3 and C2 both have the same imageable layer. The results are given in Table 1.

TABLE 1

| Example | Solvent Mix[a] | Exposure (mJ/cm²) | Time to Dissolve (min) |
|---|---|---|---|
| 1 | A | 240 | >35 |
| 1 | B | 240 | >40 |
| 2 | A | 240 | >35 |
| 2 | B | 240 | >40 |
| C1 | A | 240 | 30 |
| C1 | B | 240 | 30 |
| 3 | A | 240 | 13 |
| 3 | A | 480 | 11 |
| 3 | B | 240 | >13 |
| 3 | B | 480 | >13 |
| C2 | A | 240 | 7 |
| C2 | A | 480 | 7 |
| C2 | B | 240 | 10 |
| C2 | B | 480 | 10 |

[a]Solvent Mix A is diacetone/alcohol (80:20 by volume); Solvent Mix B is 2-butoxyethanol/water (80:20 by volume).

Example 5

This example illustrates preparation and evaluation of a negative working multi-layer imageable element that contains a photothermal conversion material in the imageable layer. The multi-layer imageable element was prepared as follows:

A coating solution containing BKS-5928 (39.99 wt %), N-9P (51.23 wt %), Diazo MSPF6 (2.57 wt %), IR Dye A (2.77 wt %), terephthaldehyde (2.28 wt %), Blue Dye B (0.30 wt %), and XDSA (0.86 wt %) in 1-methoxypropan-2-ol/acetone (97:3 by weight) was coated over the underlayer of Example 2 with a wire wound bar. The imageable layer coating weight was 1.3 g/m². The resulting element, consisting of the above imageable layer, the underlayer of Example 2, and the substrate of Example 1, was dried at 100° C. for 90 sec.

After 48 hr, an element was imaged with 830 nm radiation using the internal solid image test pattern (100% exposure) of a Creo 3230 Trendsetter (Creo Products, Burnaby, BC, Canada) with an imaging energy density of 110 mJ/cm². The imaged element was heated in a forced air oven at about 121° C. for 1 min, cooled, and processed (22° C., 60 sec dwell time, water rinse) with MX1710 Developer (potassium silicate developer, Kodak Polychrome Graphics, Norwalk, Conn., USA). The imaged regions of the imageable layer and underlayer remained, leaving an accurate copy of the internal test pattern.

Comparative Example 3

This example illustrates preparation and evaluation of a negative working imageable element that contains a photothermal conversion material in the imageable layer. The element does not comprise an underlayer.

The imageable layer of Example 5 was coated directly onto the substrate of Example1. The imageable layer coating weight was 1.3 g/m². The resulting element, consisting of the imageable layer of Example 5 on the substrate of Example 1, was dried at 100° C. for 90 sec.

Example 6

The imageable elements of Examples 5 and Comparative Examples 3 (C3) were imaged and heated as described in Example 4. The results are given in Table 2.

TABLE 2

|  | Example 5 | | Example C3 | |
|---|---|---|---|---|
|  | Unexposed | Exposed | Unexposed | Exposed |
| MX1710 Developer | <10 sec | 150 sec | <10 sec | 150 sec |
| Solvent Mix A | 60 sec | <240 sec | <10 sec | <10 sec |
| Solvent Mix B | 90 sec | <240 sec | <10 sec | <10 sec |

[a]Solvent Mix A is diacetone/alcohol (80:20 by volume); Solvent Mix B is 2-butoxyethanol/water (80:20 by volume).

The imageable element of the invention showed increased resistance to solvent mixes A and B, common solvents used in lithographic printing. However, there was no effect on its performance in the developer.

Example 7

This example describes the preparation of Copolymer 1.

Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) were added and dissolved with stirring. 2,2-Azobisisobutyronitrile (AIBN) (3.4 g) was added and the reaction mixture heated at 60° C. with stirring for 22 hr. Then methanol was added. The precipitated Copolymer 1, a copolymer of N-phenylmaleimide, methacrylamide, and methacrylic acid (45:35:20 mol %), was filtered, washed twice with methanol, and dried in the oven at 40° C. for 2 days.

If the polymerization is carried out in 1,3-dioxolane, in some cases reprecipitation can be avoided. The monomers are soluble in 1,3-dioxolane, but the polymeric material is insoluble and precipitates during the reaction.

By appropriate modification of the relative amounts of methacrylic acid, N-phenylmaleimide, and methacrylamide used in the reaction, other methacrylic acid/N-phenylmaleimide /methacrylamide copolymers may be prepared by this general procedure. For example, a copolymer of N-phenylmaleimide, methacrylamide, and methacrylic acid (50:35:15 mol %), was prepared using methacrylic acid (27.1 g), N-phenylmaleimide (183.7 g), methacrylamide (62.5 g), and AIBN (3.4 g).

Having described the invention, we now claim the following and their equivalents.

What is claimed is:

1. An imageable element comprising, in order:
   a support;
   an underlayer; and
   an imageable layer;
   in which:
   the underlayer comprises a photothermal conversion material;
   the imageable layer comprises a negative working imageable composition;
   the underlayer is soluble or dispersible in a developer; and
   the negative working imageable composition comprises a polymeric diazonium compound and a binder.

2. The element of claim 1 in which the binder is an acetalized polyvinyl alcohol with pendent carboxyl groups.

3. An imageable element comprising, in order:
   a support;
   an underlayer; and
   an imageable layer;
   in which:
   the underlayer comprises a photothermal conversion material;
   the imageable layer comprises a negative working imageable composition;
   the underlayer is soluble or dispersible in a developer; and
   the negative working imageable composition is a photopolymerizable composition.

4. The element of claim 3 in which the photopolymerizable composition comprises a photoinitiator system activatable by ultraviolet or visible radiation.

5. The element of claim 3 in which the photopolymerizable composition comprises a photoinitiator system activatable by infrared radiation.

6. The element of claim 3 in which the photothermal conversion material is a dye that absorbs in the range of 750 nm to 1200 nm.

7. An imageable element comprising, in order:
   a support;
   an underlayer; and
   an imageable layer;
   in which:
   the imageable layer comprises a negative working imageable composition; and
   the underlayer is soluble or dispersible in a developer; and
   the underlayer comprises a copolymer that comprises about 35 to about 60 mol % of N-phenylmaleimide, about 15 to about 40 mol % of methacrylamide, and about 10 to about 30 mol % of methacrylic acid.

8. A method for forming an image, the method comprising the steps of, in order:
   (A) imaging an imageable element and forming an exposed imageable element comprising exposed and unexposed regions, the imageable element comprising, in order:
   a support;
   an underlayer; and
   an imageable layer;
   in which:
   the imageable layer comprises a negative working imageable composition;
   the underlayer comprises a photothermal conversion material;
   the underlayer is soluble or dispersible in a developer;
   the negative working imageable composition comprises a monomer, a binder and a photoinitiator system activatable by ultraviolet or visible radiation; and
   imaging is carried out with ultraviolet or visible radiation; and
   (B) developing the exposed imageable element and removing the unexposed regions to form the image.

9. The method of claim 8 in which the photoinitiator system is activatable by ultraviolet radiation, and imaging is carried out with ultraviolet radiation.

10. A method for forming an image, the method comprising the steps of, in order:
    (A) imaging an imageable element and forming an exposed imageable element comprising exposed and unexposed regions, the imageable element comprising, in order:
    a support;
    an underlayer; and
    an imageable layer;
    in which:
    the imageable layer comprises a negative working imageable composition;
    the underlayer comprises a photothermal conversion material;
    the underlayer is soluble or dispersible in a developer;
    the negative working imageable composition comprises a monomer, a binder and a thermally activatable initiator system; and
    imaging is carried out with infrared radiation or with heat; and
    (B) developing the exposed imageable element and removing the unexposed regions to form the image.

11. The method of claim 10 in which the initiator system is activatable by infrared radiation and imaging is carried out with infrared radiation.

12. A method for forming an image, the method comprising the steps of, in order:
    (A) imaging an imageable element and forming an exposed imageable element comprising exposed and unexposed regions, the imageable element comprising, in order:
    a support;
    an underlayer; and
    an imageable layer;
    in which:
    the imageable layer comprises a negative working imageable composition;
    the underlayer comprises a photothermal conversion material;
    the underlayer is soluble or dispersible in a developer;
    the negative working imageable composition comprises a polymeric diazonium compound and a binder; and
    (B) developing the exposed imageable element and removing the unexposed regions to form the image.

13. The method of claim 12 in which imaging is carried out with ultraviolet radiation.

14. The method of claim 12 in which imaging is carried out thermally.

15. The method of claim 12 in which the binder is a polymeric acetal resin.

16. An image useful as a lithographic printing plate prepared by a method comprising the steps of, in order:
(A) imaging an imageable element and forming an exposed imageable element comprising exposed and unexposed regions, the imageable element comprising, in order:
a support;
an underlayer; and
an imageable layer;
in which:
the imageable layer comprises a negative working imageable composition;
the underlayer comprises a photothermal conversion material;
the underlayer is soluble or dispersible in a developer;
the negative working imageable composition comprises a monomer, a binder and a photoinitiator system activatable by ultraviolet or visible radiation; and
imaging is carried out with ultraviolet or visible radiation; and
(B) developing the exposed imageable element and removing the unexposed regions to form the image.

17. The image of claim 16 in which
the initiator system is activatable by infrared radiation and imaging is carried out with infrared radiation.

18. An image useful as a lithographic printing plate prepared by a method comprising the steps of, in order:
(A) imaging an imageable element and forming an exposed imageable element comprising exposed and unexposed regions, the imageable element comprising, in order:
a support;
an underlayer; and
an imageable layer;
in which:
the imageable layer comprises a negative working imageable composition;
the underlayer comprises a photothermal conversion material;
the underlayer is soluble or dispersible in a developer;
the negative working imageable composition comprises a polymeric diazonium compound and a binder; and
(B) developing the exposed imageable element and removing the unexposed regions to form the image.

19. The image of claim 18 in which imaging is carried out with ultraviolet radiation.

20. The image of claim 18 in which imaging is carried out thermally.

21. The element of claim 1 in which the underlayer comprises a copolymer that comprises about 35 to about 60 mol % of N-phenylmaleimide, about 15 to about 40 mol % of methacrylamide, and about 10 to about 30 mol % of methacrylic acid.

22. The element of claim 3 in which
the underlayer comprises a copolymer that comprises about 35 to about 60 mol % of N-phenylmaleimide, about 15 to about 40 mol % of methacrylamide, and about 10 to about 30 mol % of methacrylic acid.

23. The element of claim 1 in which the photothermal conversion material is a dye that absorbs in the range of 750 nm to 1200 nm.

24. The method of claim 8 in which the photothermal conversion material is a dye that absorbs in the range of 750 nm to 1200 nm.

25. The method of claim 10 in which the photothermal conversion material is a dye that absorbs in the range of 750 nm to 1200 nm.

26. The method of claim 8 in which the underlayer comprises a copolymer that comprises about 35 to about 60 mol % of N-phenylmaleimide, about 15 to about 40 mol % of methacrylamide, and about 10 to about 30 mol % of methacrylic acid.

27. The method of claim 12 in which the underlayer comprises a copolymer that comprises about 35 to about 60 mol % of N-phenylmaleimide, about 15 to about 40 mol % of methacrylamide, and about 10 to about 30 mol % of methacrylic acid.

* * * * *